US010871527B2

United States Patent
Diop et al.

(10) Patent No.: US 10,871,527 B2
(45) Date of Patent: Dec. 22, 2020

(54) ELECTRICAL CONNECTOR WITH SENSOR

(71) Applicant: Hubbell Incorporated, Shelton, CT (US)

(72) Inventors: Seydou Diop, Birmingham, AL (US); Adrian Beau Candelaria, Alabaster, AL (US)

(73) Assignee: Hubbell Incorporated, Shelton, CT (US)

( * ) Notice: Subject to any disclaimer, the term of this patent is extended or adjusted under 35 U.S.C. 154(b) by 74 days.

(21) Appl. No.: 16/172,137

(22) Filed: Oct. 26, 2018

(65) Prior Publication Data

US 2019/0128947 A1    May 2, 2019

Related U.S. Application Data

(60) Provisional application No. 62/577,483, filed on Oct. 26, 2017.

(51) Int. Cl.

| | |
|---|---|
| G01R 31/04 | (2006.01) |
| G01R 31/66 | (2020.01) |
| G01R 27/16 | (2006.01) |
| G01K 7/36 | (2006.01) |
| H01R 4/52 | (2006.01) |
| G01K 13/00 | (2006.01) |
| H01R 13/66 | (2006.01) |

(52) U.S. Cl.
CPC ............. *G01R 31/66* (2020.01); *G01K 7/36* (2013.01); *G01K 13/00* (2013.01); *G01R 27/16* (2013.01); *H01R 4/52* (2013.01); *H01R 13/6683* (2013.01)

(58) Field of Classification Search
None
See application file for complete search history.

(56) References Cited

U.S. PATENT DOCUMENTS

| | | |
|---|---|---|
| 6,323,097 B1 | 11/2001 | Wu et al. |
| 6,798,204 B2 | 9/2004 | Seeber et al. |
| 2006/0232167 A1 | 10/2006 | Jordan |
| 2009/0015239 A1* | 1/2009 | Georgiou ............... G01R 15/14 324/105 |
| 2010/0262391 A1* | 10/2010 | Sauermann ............ G01R 31/68 702/58 |
| 2016/0076945 A1* | 3/2016 | Wen ........................ G01K 7/34 374/184 |
| 2016/0124024 A1* | 5/2016 | Jefferies ................. G01R 35/02 324/127 |

(Continued)

FOREIGN PATENT DOCUMENTS

WO    2014176784    11/2014

OTHER PUBLICATIONS

PCT/US2018/057758 International Search Report and Written Opinion dated Jan. 15, 2019 (17 pages).

*Primary Examiner* — Jas A Sanghera
(74) *Attorney, Agent, or Firm* — Michael Best & Friedrich, LLP

(57) ABSTRACT

A connector system includes a connector for connecting a first conductor in electrical communication with a second conductor, and a sensor supported adjacent the connector. The sensor is in electrical communication with the first conductor and in electrical communication with the second conductor. The sensor detects a characteristic of the connection between the first conductor and the second conductor.

23 Claims, 8 Drawing Sheets

(56) References Cited

U.S. PATENT DOCUMENTS

2017/0138796 A1    5/2017   Yoshida et al.
2017/0156668 A1    6/2017   Husain
2017/0169928 A1    6/2017   Carrow et al.

* cited by examiner

ELECTRICAL CONNECTOR WITH SENSOR

REFERENCE TO RELATED APPLICATION

This application claims the benefit of prior-filed U.S. Provisional Patent Application No. 62/577,483, filed Oct. 26, 2017, the entire contents of which are incorporated by reference.

BACKGROUND

The present disclosure relates to electrical connectors, and more specifically to a sensor and connector for electrically connecting electrical conductors.

SUMMARY

A connector such as a splice may provide an electrical connection between two electrical conductors, such as power lines. Many conventional connectors include a sleeve or tube within which the connection is made.

In one aspect, a connector system includes a connector for connecting a first conductor in electrical communication with a second conductor, and a sensor supported adjacent the connector. The sensor is in electrical communication with the first conductor and in electrical communication with the second conductor. The sensor detects a characteristic of the connection between the first conductor and the second conductor.

In another aspect, a connector system includes a connector for connecting a first conductor in electrical communication with a second conductor; a coil disposed around at least a portion of the connector, a current in the coil being induced by an electric field caused by current passing between the first and second conductors; and a sensor for detecting a characteristic of the electrical connection between the first conductor and the second conductor, the sensor in electrical communication with the coil.

In yet another aspect, method for monitoring an electrical connection between a first electrical conductor and a second electrical conductor, the method includes: engaging the first electrical conductor with one end of an electrical connector; engaging the second electrical conductor with another end of the electrical connector; placing the first electrical conductor in electrical communication with a sensor positioned adjacent the electrical connector and capable of detecting a characteristic of the electrical connection between the first conductor and the second conductor; and placing the second electrical conductor in electrical communication with the sensor.

Other aspects will become apparent by consideration of the detailed description and accompanying drawings.

DETAILED DESCRIPTION

Before any embodiments are explained in detail, it is to be understood that the disclosure is not limited in its application to the details of construction and the arrangement of components set forth in the following description or illustrated in the following drawings. The disclosure is capable of other embodiments and of being practiced or of being carried out in various ways. Also, it is to be understood that the phraseology and terminology used herein is for the purpose of description and should not be regarded as limiting. Use of "including" and "comprising" and variations thereof as used herein is meant to encompass the items listed thereafter and equivalents thereof as well as additional items. Use of "consisting of" and variations thereof as used herein is meant to encompass only the items listed thereafter and equivalents thereof. Unless specified or limited otherwise, the terms "mounted," "connected," "supported," and "coupled" and variations thereof are used broadly and encompass both direct and indirect mountings, connections, supports, and couplings.

In general, the present disclosure relates to a connector for providing an electrical connection between electrical conductors. A sensor measures an electrical characteristic of the connection, which can provide an operator with an indicator of the quality of the electrical connection.

Figure 1:
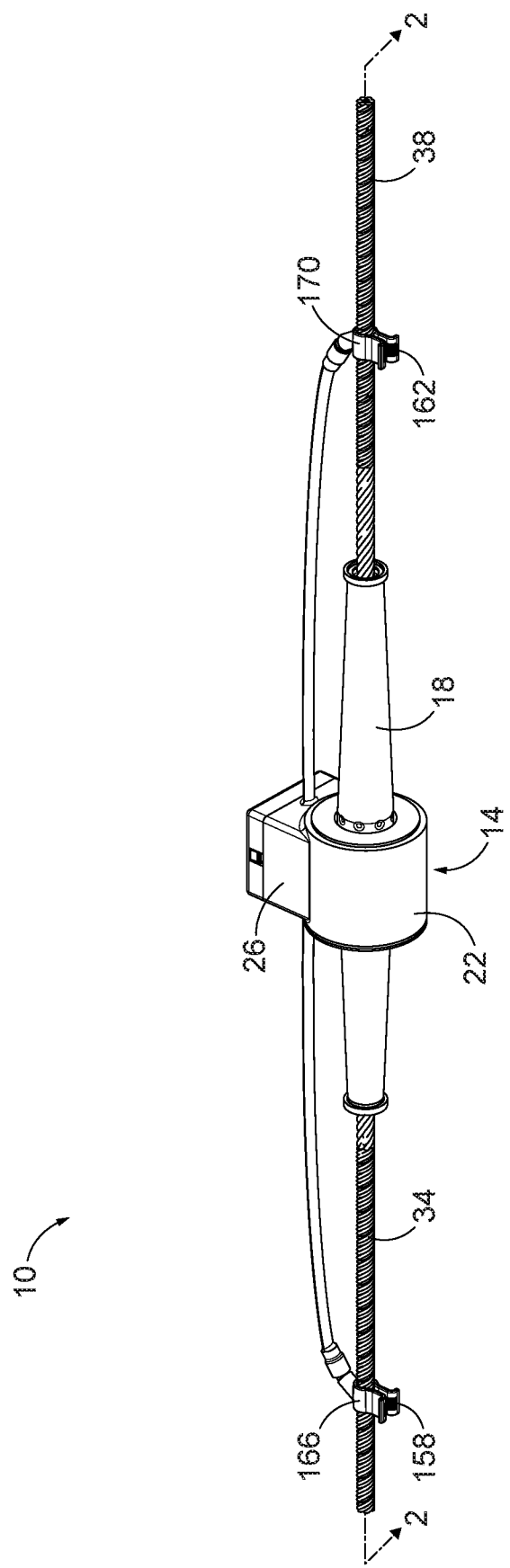
FIG. 1 is a perspective view of a connector system.

As shown in FIG. 1, a connector system 10 includes a housing 14 and a connector, e.g., a splice 18. In the illustrated embodiment, the housing 14 includes a first portion or a coaxial portion 22 and a second portion or an offset portion 26. The coaxial portion 22 is generally circular (FIG. 2B). In the illustrated embodiment, the offset portion 26 has a rectangular shape and is adjacent to the coaxial portion 22, and the coaxial portion 22 is positioned around a portion of the connector 18. In the illustrated embodiment, the connector 18 is a splice that is hollow and made from an electrically conductive material. An end of a first electrical conductor 34 and an end of a second electrical conductor 38 are positioned within the splice 18. The first electrical conductor 34 and second electrical conductor 38 can be electrical power lines, or another type of electrical conductor. The splice 18 electrically connects the first electrical conductor 34 and the second electrical conductor 38 so that the first electrical conductor 34 and the second electrical conductor 38 are in electrical communication with one another. In other embodiments, the housing 10 can include other portions, and/or the portions of the housing 14 may be constructed in a different manner.

Figure 2A:
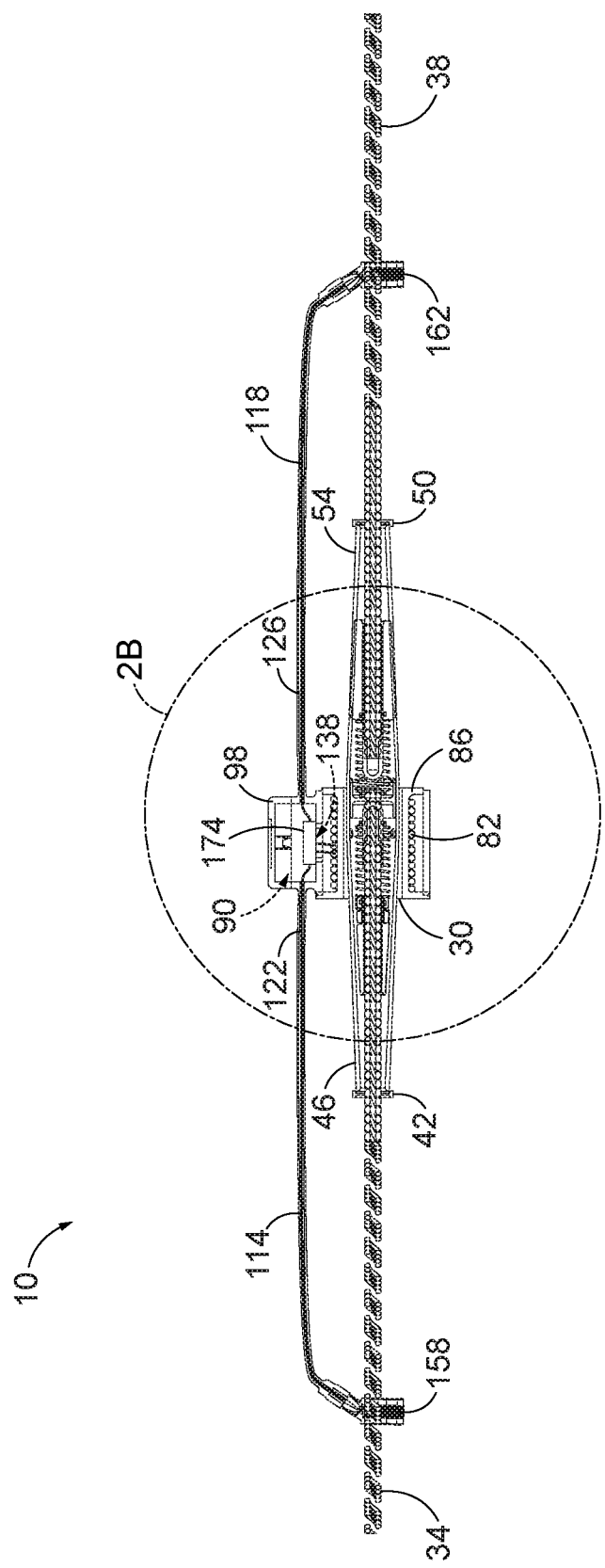
FIG. 2A is a section view of the connector system of FIG. 1, viewed along section 2-2.
Figure 2B:
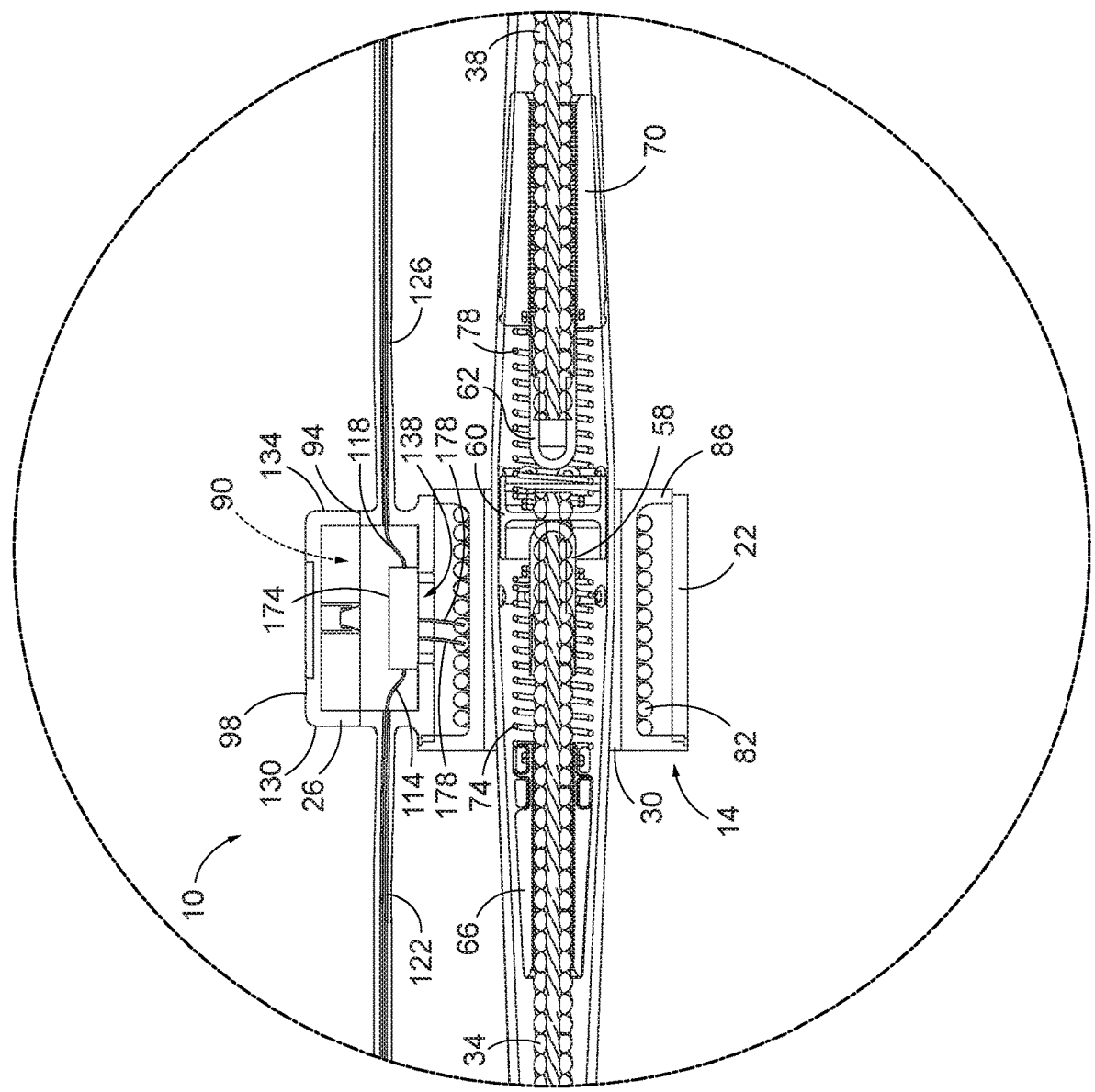
FIG. 2B is an enlarged view of area 2B of FIG. 2A.

As shown in FIG. 2A, at least a portion of the splice 18 is positioned in an aperture 30 within the coaxial portion 22. In the illustrated embodiment, the splice 18 includes a first color coded ring 42 on a first splice side 46 and a second color coded ring 50 on a second splice side 54. The first and second color coded rings 42, 50 can correspond to a characteristic (e.g., a diameter or gauge of the conductor, a maximum current load, etc.) to aid a user in assembling an appropriate conductor 34, 38 in the splice 18. The first electrical conductor 34 is inserted through the first color coded ring 42 and the second electrical conductor 38 is inserted through the second color coded ring 50. After the electrical conductor 34, 38 is inserted through the respective ring 42, 50, the electrical conductor 34, 38 contacts a pilot cup; that is, the first electrical conductor 34 contacts a first pilot cup 58 and the second electrical conductor 38 contacts a second pilot cup 62 (FIG. 2B).

As shown in FIG. 2B, in the illustrated embodiments the first pilot cup 58 and the second pilot cup 62 are concave members. Each electrical conductor 34, 38 engages the associated pilot cup 58, 62, respectively, so that each electrical conductor 34, 38 moves with the associated pilot cup 58, 62, toward an intermediate stop 60 proximate an intermediate portion of the splice 18.

In some embodiments, the first pilot cup 58 assists in guiding the first electrical conductor 34 through a first pair of jaws 66 and the second pilot cup 62 assists in guiding the second electrical conductor 38 through a second pair of jaws 70. In the illustrated embodiment, the first pair of jaws 66 and the second pair of jaws 70 are adjacent an inner surface of the splice 18. The first pair of jaws 66 and the second pair of jaws 70 include teeth for engaging and securing the associated electrical conductor 34, 38. The first pair of jaws 66 is coupled to a first spring or first biasing member 74 and the second pair of jaws 70 is coupled to a second spring or second biasing member 78. The first spring 74 and second spring 78 initially bias the first and second pairs of jaws 66, 70 away from the intermediate stop 60. Once the pilot cups 58, 62 and the electrical conductors 34, 38 are inserted into the jaws 66, 70, the springs 74, 78 are compressed towards the intermediate stop 60. After the first pilot cup 58 and first electrical conductor 34 pass through the first set of jaws 66, the first pilot cup 58 is positioned adjacent the intermediate stop 60. The first spring 74 returns to an initial or non-actuated position and the teeth secure the first electrical conductor 34 within the splice 18. Similarly, the second pilot cup 62 and second electrical conductor 38 pass through the second set of jaws 70, and the second pilot cup 62 is positioned adjacent the intermediate stop 60. The second spring 78 returns to an initial or non-actuated position and the teeth secure the second electrical conductor 38 within the splice 18.

Figure 3:
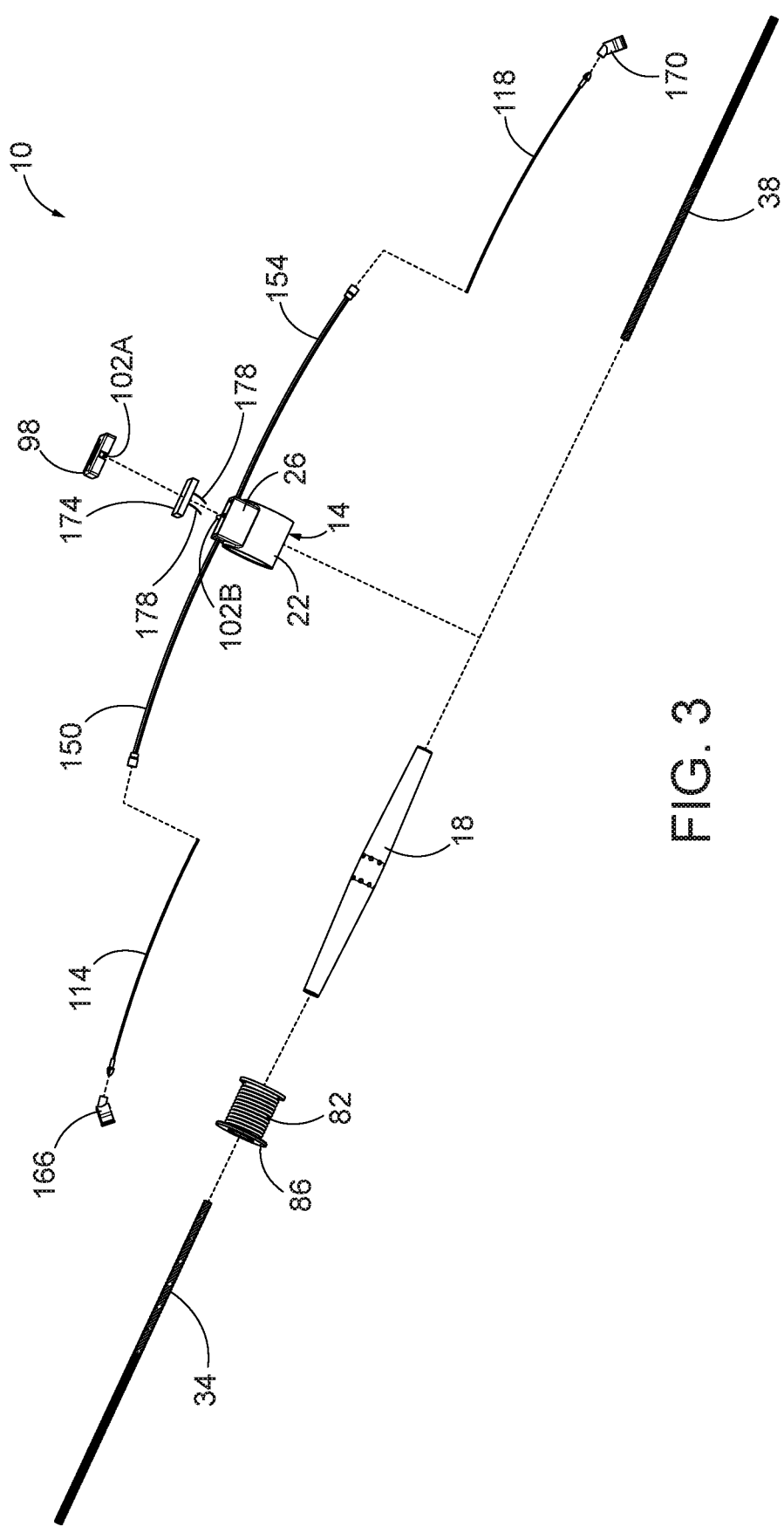
FIG. 3 is an exploded view of the connector system of FIG. 1.
Figure 4:
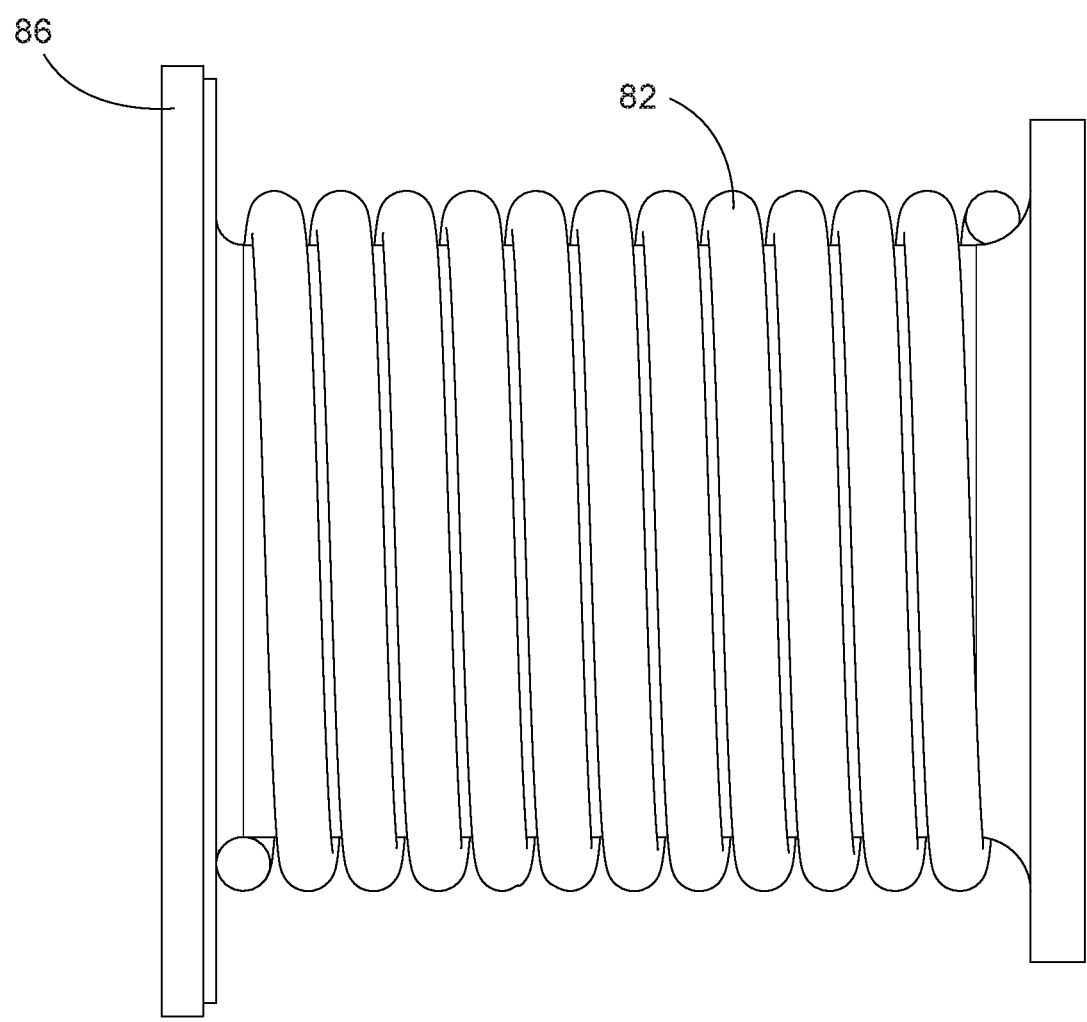
FIG. 4 is a side view of a hub and a coil.

As best shown in FIG. 4, the connector system further includes a conducting coil 82. In the illustrated embodiment, the conducting coil 82 is formed in a helical arrangement and wraps around a hub or spool 86. The conducting coil 82 can be formed from a wire or another conductor. In the illustrated embodiment, as shown in FIG. 2A and FIG. 3, the aperture 30 extends through spool 86, and the conducting coil 82 and the spool 86 extend around the splice 18. The spool 86 may be formed from an electrically insulating material to provide electrical isolation between the conducting coil 82 and the splice 18. The spool 86 is positioned within the housing 14, and an outer surface of the spool 86 has a diameter that is smaller than a diameter of the coil 82. In other embodiments, the spool 86 and the conducting coil 82 may not extend around the splice 18. In still other embodiments, the conductive coil 82 may include an insulated casing and may not be formed around a spool 86.

Figure 6:
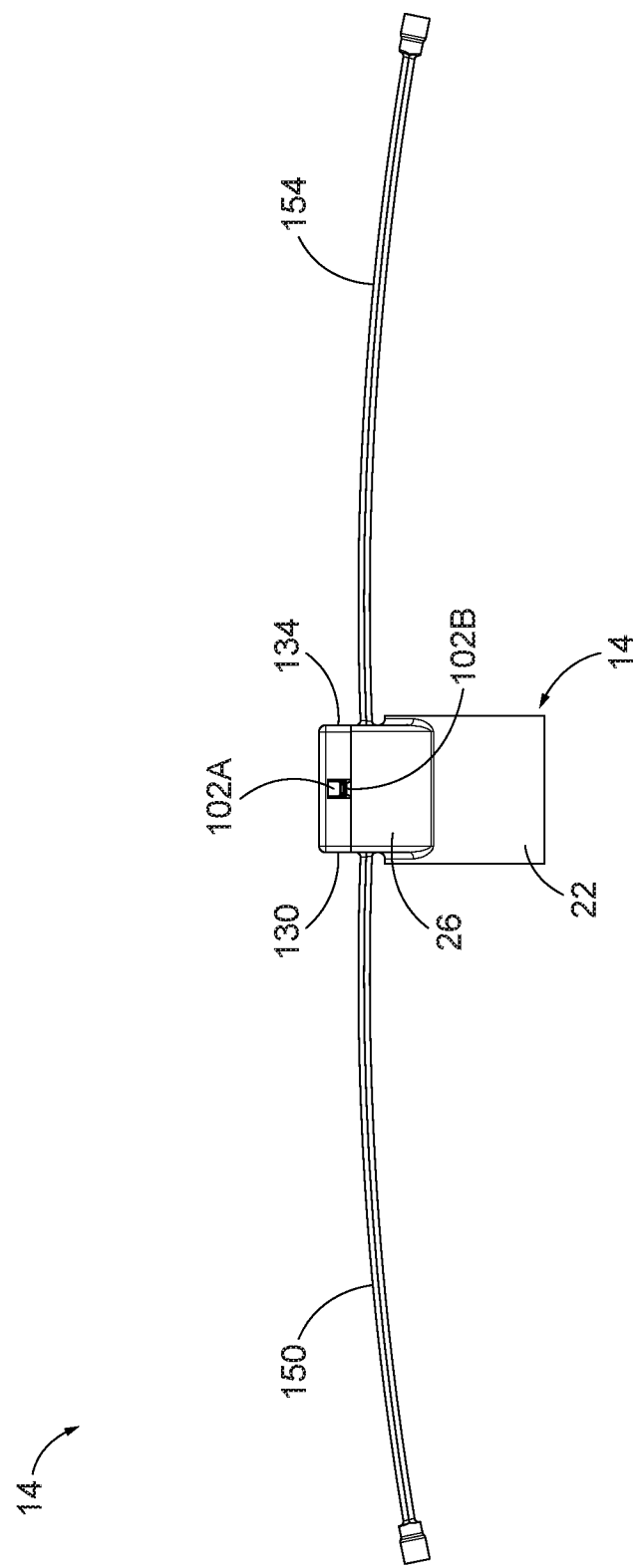
FIG. 6 is a side view of a housing.

Referring back to FIG. 2B as well as to FIG. 3, the offset portion 26 includes a chamber or cavity 90 that positioned between an outer edge 94 of the offset portion 26 and the coaxial portion 22. An electrical measuring instrument or sensor 174 is supported by the housing 14. In the illustrated embodiment, the sensor 174 is supported within the cavity 90 of the offset portion 26. A housing cap 98 is secured to the offset portion 26 to enclose and protect the sensor 174. The cap 98 may be secured to the housing 14 by latches 102 (FIG. 6).

As shown in FIGS. 2B and 3, the sensor 174 is electrically connected to the first electrical conductor 34 and the second electrical conductor 38. A first connecting wire 114 connects the sensor 174 to the first electrical conductor 34 and a second connecting wire 118 connects the sensor 174 to the second electrical conductor 38. The connecting wires 114, 118 provide the sensor 174 with electrical communication from the first electrical conductor 34 and the second electrical conductor 38. In the illustrated embodiment, the first wire 114 extends between the cavity 90 through a first passageway 122 (FIG. 2B), and the second wire 118 extends between the cavity 90 through a second passageway 126. The first passageway 122 is positioned adjacent a first housing end 130 and the second passageway 126 is positioned adjacent a second housing end 134 opposite the first housing end 130. In other embodiments, the system may not include a cap 98, and the first wire 114 and the second wire 118 may pass over an edge 94 of the housing to connect to the sensor 174. In still further embodiments, the sensor 174 can be positioned on an exterior face of the housing 14 or the cap 98, and/or the first wire 114 and the second wire 118 may be positioned outside of passageways 122, 126.

By electrically connecting each of the first wire 114 and the second wire 118 to the sensor 174, the sensor 174 can detect and measure a characteristic of the electrical communication between the first electrical conductor 34 and the second electrical conductor 38. The characteristic of electrical communication can be one or more measurable aspects of the connection. For example, the characteristic of electrical communication can include, but is not limited to, voltage, current, resistance, or power. In addition, in some embodiments a sensor 174 is coupled to an outer surface of the splice 18 to measure thermal characteristics, such as a temperature of the connector or heat transferred to the connector 18. In some embodiments, the sensor 174 includes multiple sensors for measuring more than one electrical and/or thermal characteristic or other aspect. In some embodiments, the sensor 174 is a radio frequency identification (RFID) temperature sensor.

In the present embodiment, the sensor 174 is configured to measure a resistance between the first electrical conductor 34 and the second electrical conductor 38. Among other things, the measured resistance between the first electrical conductor 34 and the second electrical conductor 38 can provide an indication (i.e. via visual, tactile, auditory, or wirelessly transmitted signals) that the connection has failed or is failing. An increase in the measured resistance, for example, may indicate that the electrical contact between the first electrical conductor 34 and the second electrical conductor 38 is not strong. This may help an operator determine when to replace or repair the connector.

The first wire 114, the second wire 118, and the sensor 174 are also in electrical connection with the conducting coil 82 through one or more wires 178. For example, the bottom of the cavity 90 can include a slot 138 to permit the wires 178 to connect to the conducting coil 82. The splice 18 induces an electric field as a current passes through the first and second conductors 34, 38. The electric field induces or generates a current in the coil 82 that can both power the sensor 174 and allows the sensor 174 to measure a resistance.

Figure 5:
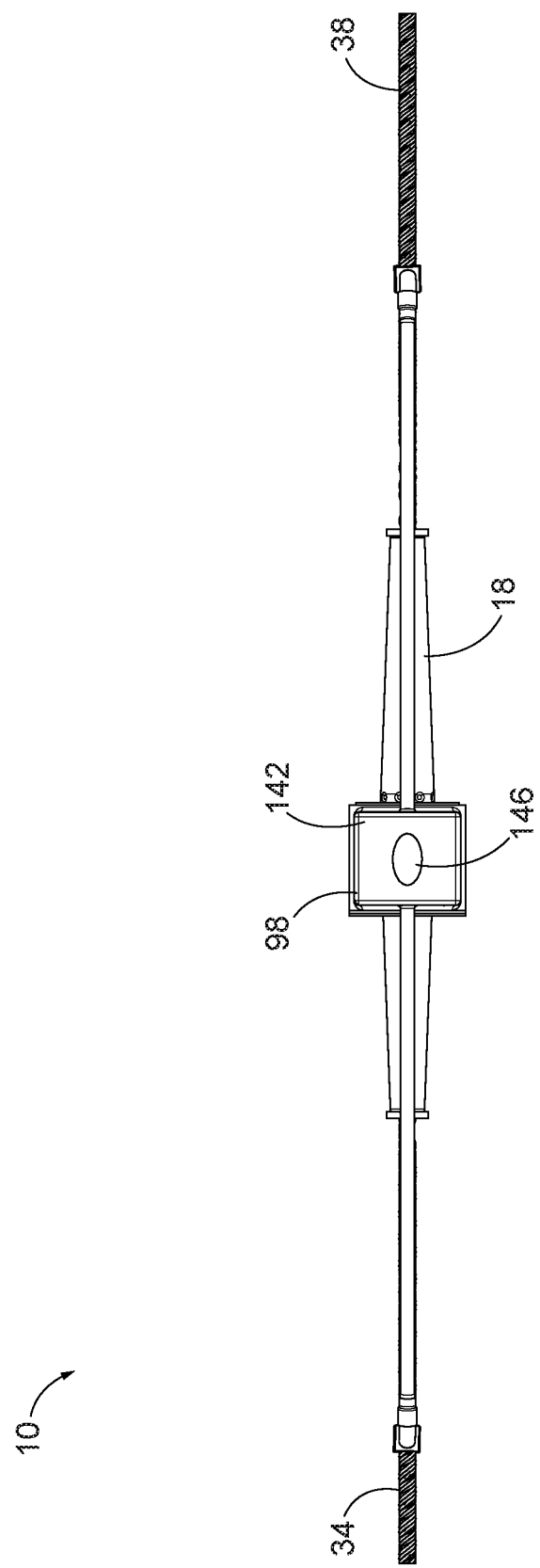
FIG. 5 is another side view of the connector system of FIG. 1.

FIG. 5 shows the top face 142 of the cap 98. In some embodiments, the top face 142 of the cap 98 includes an interface 146 (e.g., an electrical screen). The interface 146 displays the readings from the sensor 174 (FIG. 2B), allowing the sensor's data to be read without removing the cap 98 to access the sensor 174. At least one switch (not shown) may be used to change the sensor 174 from an "off" condition to an "on" condition. Alternatively, the interface 146 can be "on" at all times. In other embodiments, the interface 146 can be positioned on another face of the housing 14 or the cap 98. Also, the interface 146 may be a simple light indicator (e.g., an LED having a color to indicate when the sensed characteristic is below a predetermined threshold) or other visual indicators. In further embodiments, the interface can provide auditory or tactile indicators. In still other embodiments, the connector system 10 may not include an interface on a housing but instead may transmit data wirelessly to a receiver (not shown).

As shown in FIG. 6, a first insulating member 150 extends from the first housing end 130 of the housing 14, and a second insulating member 154 extends from the second housing end 134. The first passageway 122 (FIG. 2B) passes through the first insulating member 150, which encases the first wire 114. The second passageway 126 passes through the second insulating member 154, which encases the second wire 118.

In the illustrated embodiment, at least one female latch 102A is formed on the cap 98. At least one male latch 102B extends from the housing 14 (e.g., the offset portion 26). The male latch(es) 102B mate with the female latch(es) 102A to secure the cap 98 to the offset portion 26. In other embodiments, the male latch(es) 102B may extend from the cap 98, while the female latch(es) 102A may be formed on the offset portion 26. In further embodiments, other securing means (e.g., hinges) can be used.

Figure 7:
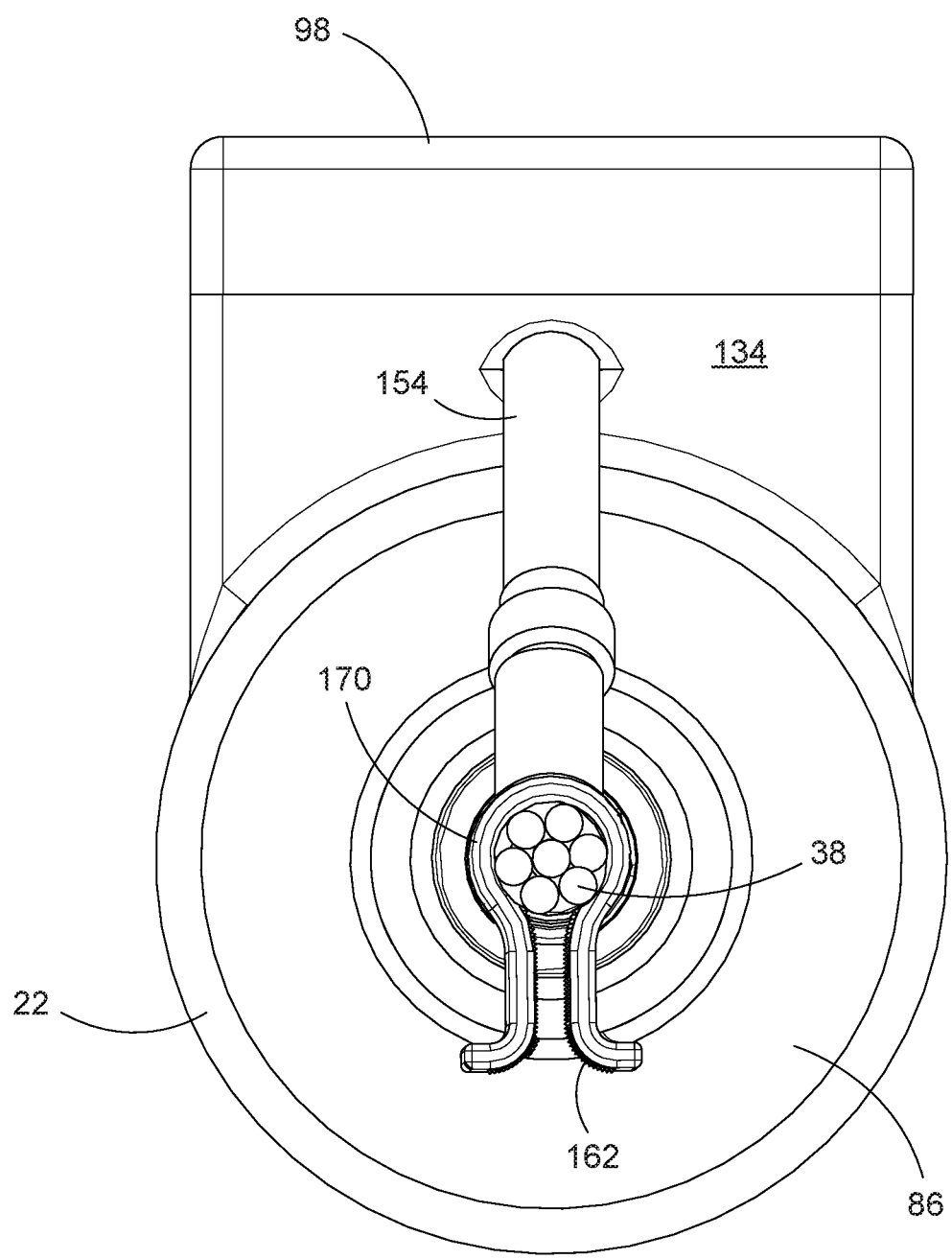
FIG. 7 is an end view of the connector system of FIG. 1.

In the illustrated embodiment of FIG. 1, the first wire 114 is coupled to a first securing member or first clip 158 and the second wire 118 is coupled to a second securing member or second clip 162. The first clip 158 engages the first electrical conductor 34 to provide electrical contact between the first wire 114 and the first electrical conductor 34. Likewise, the second clip 162 engages the second electrical conductor 38 to provide electrical contact between the second wire 118 and the second electrical conductor 38. The clips 158, 162 are secured to the electrical conductors 34, 38. The first clip 158 includes a first cover 166 and the second clip 162 includes cover 170. As shown in FIG. 7, the cover 170 encases an outer surface of the respective clip 162 to provide an insulating layer on the outer surface while still leaving an inner surface exposed to engage the conductor 38 in electrical contact.

Although aspects have been described in detail with reference to certain preferred embodiments, variations and modifications exist within the scope and spirit of one or more independent aspects as described.

What is claimed is:

1. A connector system comprising:
a connector for connecting a first conductor in electrical communication with a second conductor, the connector including an elongated body having a first end and a second end, the first conductor being received within the elongated body and extending from the first end, the second conductor being received within the elongated body and extending from the second end; and
a sensor supported adjacent the connector, the sensor in electrical communication with the first conductor and in electrical communication with the second conductor, the sensor detecting a characteristic of the electrical communication between the first conductor and the second conductor.

2. The connector system of claim 1, further comprising a conducting coil extending around at least a portion of the connector, the conducting coil being electrically connected to the sensor.

3. The connector system of claim 2, further comprising a spool positioned between the connector and the conducting coil.

4. The connector system of claim 2, wherein an electric current passing between the first conductor and the second conductor creates an electric field that induces a current in the conducting coil.

5. The connector system of claim 1, wherein the sensor is supported by a housing including a first passageway and a second passageway, the first passageway receiving a first wire providing electrical communication between the first conductor and the sensor, the second passageway receiving a second wire providing electrical communication between the second conductor and the sensor.

6. The connector system of claim 1, wherein the sensor is positioned within a housing and is selectively coverable by a cap.

7. The connector system of claim 1, further comprising a first clip and a second clip, the first clip configured to engage the first conductor in electrical contact, the second clip configured to engage the second conductor in electrical contact.

8. The connector system of claim 1, wherein the characteristic of the electrical communication is a resistance between the first conductor and the second conductor.

9. The connector system of claim 1, wherein the sensor is an RFID temperature sensor and the characteristic of the electrical communication is a temperature.

10. The connector system of claim 1, further comprising an indicator for displaying measured readings, the indicator positioned on an external surface of the connector system.

11. The connector system of claim 1, wherein the connector includes a first pair of jaws positioned within the elongated body that receive and secure the first conductor relative to the connector and a second pair of jaws positioned within the elongated body that receive and secure the second conductor relative to the connector.

12. The connector system of claim 1, further comprising a housing having a first portion that supports the connector and a second portion that supports the sensor.

13. The connector system of claim 12, wherein the first portion is coaxial with the connector and the second portion is offset from the first portion.

14. A connector system comprising:
a connector for connecting a first conductor in electrical communication with a second conductor;
a coil disposed around at least a portion of the connector, a current in the coil being induced by an electric field caused by current passing between the first and second conductors; and
a sensor in electrical communication with the first conductor and in electrical communication with the second conductor, the sensor detecting a characteristic of the electrical communication between the first conductor and the second conductor, the sensor in electrical communication with the coil.

15. The connector system of claim 14, wherein the sensor is powered by current in the coil.

16. The connector system of claim 14, wherein the characteristic of the electrical communication is a resistance between the first conductor and the second conductor.

17. The connector system of claim 14, wherein the sensor is an RFID temperature sensor and the characteristic of the electrical communication is a temperature.

18. A method for monitoring an electrical connection between a first electrical conductor and a second electrical conductor, the method comprising:

positioning the first electrical conductor within an elongated body of an electrical connector such that the first electrical conductor extends from a first end of the elongated body;

positioning the second electrical conductor within the elongated body of the electrical connector such that the first electrical conductor extends from a second end of the elongated body;

placing the first electrical conductor in electrical communication with a sensor positioned adjacent the electrical connector and capable of detecting a characteristic of the electrical connection between the first electrical conductor and the second electrical conductor; and placing the second electrical conductor in electrical communication with the sensor.

19. The method of claim 18, further comprising positioning a conducting coil around the electrical connector, the conducting coil electrically connected to the sensor.

20. The method of claim 18, wherein placing the first electrical conductor in electrical communication with the sensor includes engaging the first electrical conductor with a first wire electrically connected to the sensor, wherein placing the second electrical conductor in electrical communication with the sensor includes engaging the second electrical conductor with a second wire electrically connected to the sensor.

21. The method of claim 20, wherein engaging the first electrical conductor includes coupling a first clip to the first electrical conductor, wherein engaging the second electrical conductor includes coupling a second clip to the second electrical conductor.

22. The method of claim 18, further comprising outputting the characteristic of the electrical connection via an indicator positioned on an outer surface of sensor housing.

23. The method of claim 18, wherein the characteristic of the electrical connection is at least one of a temperature and a resistance.

* * * * *